United States Patent
Wang et al.

(10) Patent No.: US 9,153,570 B2
(45) Date of Patent: Oct. 6, 2015

(54) ESD TOLERANT I/O PAD CIRCUIT INCLUDING A SURROUNDING WELL

(75) Inventors: Shih-Yu Wang, Taipei (TW); Chia-Ling Lu, Taipei (TW); Yan-Yu Chen, Taipei (TW); Yu-Lien Liu, Hsinchu (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 663 days.

(21) Appl. No.: 12/712,812

(22) Filed: Feb. 25, 2010

(65) Prior Publication Data

US 2011/0204447 A1  Aug. 25, 2011

(51) Int. Cl.
*H01L 23/62* (2006.01)
*H01L 27/02* (2006.01)

(52) U.S. Cl.
CPC .................................. *H01L 27/0262* (2013.01)

(58) Field of Classification Search
USPC ......... 257/206, 401, 355–357, 360–362, 363, 257/389, 358, 213, 288, E21.345, E21.618, 257/E21.619, E27.031, E29.062, E29.064, 257/E23.07, E23.151, E29.026, E29.12; 361/91.5, 56, 111
See application file for complete search history.

(56) References Cited

U.S. PATENT DOCUMENTS

| 5,882,967 | A  | * | 3/1999  | Brown et al. | 438/237 |
| 5,945,713 | A  | * | 8/1999  | Voldman | 257/355 |
| 6,140,682 | A  |   | 10/2000 | Liu et al. | |
| 6,858,902 | B1 |   | 2/2005  | Salling et al. | |
| 7,186,594 | B2 |   | 3/2007  | Yach et al. | |
| 7,187,527 | B2 |   | 3/2007  | Su et al. | |
| 7,253,064 | B2 |   | 8/2007  | Chaine et al. | |
| 2008/0088994 | A1 | * | 4/2008 | Lai | 361/56 |

* cited by examiner

*Primary Examiner* — Meiya Li
(74) *Attorney, Agent, or Firm* — Kenta Suzue; Haynes Beffel & Wolfeld LLP

(57) ABSTRACT

An electrostatic discharge tolerant device includes a semiconductor body having a first conductivity type, and a pad. A surrounding well having a second conductivity type is laid out in a ring to surround an area for an electrostatic discharge circuit in the semiconductor body. The surrounding well is relatively deep, and in addition to defining the area for the electrostatic discharge circuit, provides the first terminal of a diode formed with the semiconductor body. Within the area surrounded by the surrounding well, a diode coupled to the pad and a transistor coupled to the voltage reference are connected in series and form a parasitic device in the semiconductor body.

14 Claims, 5 Drawing Sheets

ESD TOLERANT I/O PAD CIRCUIT INCLUDING A SURROUNDING WELL

BACKGROUND OF THE INVENTION

1. Field of the Invention

The present invention relates to electrostatic discharge ESD protection in integrated circuits.

2. Description of Related Art

Integrated circuits have electrostatic discharge circuits coupled to input/output pads. A representative prior art electrostatic discharge protection circuit is described in Salling et al., U.S. Pat. No. 6,858,902, entitled EFFICIENT ESD PROTECTION WITH APPLICATION FOR LOW CAPACITANCE I/O PADS.

As shown in FIG. 4 of Salling et al., one prior art ESD circuit includes a diode between the pad and the supply potential VDD which leaks ESD events that have a high positive voltage to VDD limiting high voltage operation. The ESD circuit also has a field effect transistor between the pad and ground, with the parasitic bipolar transistor or silicon controlled rectifier SCR structure. The field effect transistor and parasitic bipolar transistor/SCR structure have a trigger voltage at which they turn on and discharge the electrostatic event.

It is desirable to provide ESD circuits that have a consistent trigger voltage, which turn on quickly in response to electrostatic discharge events, can handle high voltage operation and are usable with input/output pads on integrated circuits.

SUMMARY OF THE INVENTION

An electrostatic discharge tolerant device is described that includes a semiconductor body having a first conductivity type, typically p-type, and coupled to a voltage reference, typically ground for a p-type substrate. A pad is formed on the semiconductor body which can act as a terminal for connecting circuits implemented in the device to external wiring. A well, referred to as a surrounding well herein, having a second conductivity type (e.g., n-type for p-type substrates) is laid out in a ring to surround an area for an electrostatic discharge circuit in the semiconductor body. The surrounding well is relatively deep, and in addition to defining the area for the electrostatic discharge circuit, provides the first terminal of a diode formed with the semiconductor body. Within the area surrounded by the surrounding well, a diode coupled to the pad and a transistor coupled to the voltage reference are connected in series and with a parasitic device and provide a discharge current path confined within a discharge region formed by the deep surrounding well in the semiconductor body.

A deep interior well within the body and having the second conductivity type is located within the area surrounded by the surrounding well. A first terminal of the diode of the electrostatic discharge circuit, which is coupled to the pad, includes a doped region in the interior well having the first conductivity type. A second terminal of the diode of the electrostatic discharge circuit includes a doped region in the interior well having the second conductivity type. A source and a drain of the transistor comprise doped regions having the second conductivity type within the body, within the area surrounded by the surrounding well. A body terminal having a first conductivity type with a pickup contact is formed inside the area and coupled to the voltage reference and to the source of the transistor. A latch-up prevention bias terminal coupled to a voltage source is also provided in the body between the interior well and the transistor. An interconnect on the semiconductor body couples the second terminal of the diode to the drain of the transistor.

The surrounding well is coupled to the pad, so that under positive ESD events it achieves the same or close to the same voltage as the pad. It is also deep enough so that it tends to confine discharge current in the parasitic device within the discharge region. Thereby, carriers injected into the semiconductor body contribute to turning on the parasitic device and the transistor in an efficient and consistent manner. Also, when the voltage of the pad and the surrounding well are high, positive charge cannot flow through into the deep interior well because the diode formed by the surrounding well and the substrate is reverse-biased, and the diode formed by the deep interior well and the substrate are likewise reverse-biased. This confines positive charge within the discharge region inside the surrounding well.

Also, the structure described here is suitable for high voltage applications because there is no forward diode path from the pad to the supply voltage VDD source. This enables operation when the voltage of the pad is higher than VDD.

Trench insulators are utilized in the device as described herein, including a surrounding well trench insulator in the body between the surrounding well and the area which it encloses. Also, an interior trench insulator is formed in the body between the interior well and the drain of the transistor. The interior trench insulator has a depth deeper than the drain of the transistor. By confining the ESD current within the discharge region, the parasitic bipolar transistor turns on more uniformly.

Other aspects and features of the technology described here can be seen below in the drawings, detailed description and the claims.

DETAILED DESCRIPTION

A detailed description of embodiments of the present invention is provided with reference to the FIGS. 1-5.

Figure 1:
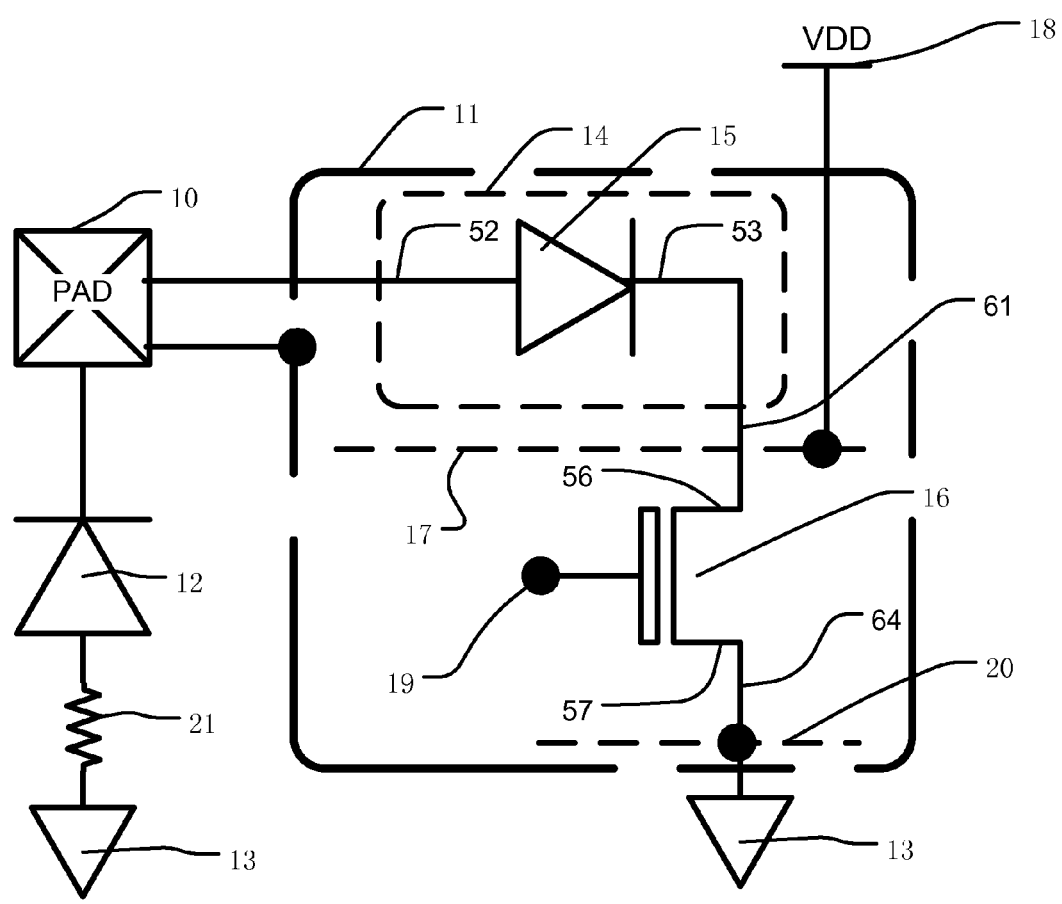
FIG. 1 is a schematic diagram of an electrostatic discharge circuit including a surrounding well as described herein.

FIG. 1 is a simplified schematic diagram showing an input/output pad 10 connected to an electrostatic discharge circuit that includes an n-type surrounding well 11 in up-type semiconductor body. More detail of the structure of the surrounding well 11 can be seen with reference to FIG. 2. The surrounding well 11 provides the cathode of a diode 12, where the anode of the diode 12 is provided by the semiconductor body. The semiconductor body is coupled with a substrate resistance 21 to ground 13. The surrounding well 11 defines an area within which a first terminal 52 and a second terminal 53 of a second diode 15 and a source terminal 57 and drain terminal 56 of the field effect transistor 16 are arranged in series between the pad 10 and ground 13. The transistor 16 is in series between the second terminal 53 of the diode 15 and ground 13. The second terminal 53 of the diode 15 is connected to the drain terminal 56 of the transistor 16 via an interconnect 61. The source terminal 57 of the transistor 16 is connected to ground 13 via line 64. The diode 15 is formed within a deep interior n-type well 14. A latch-up prevention n-type terminal 17, coupled to a voltage source 18, providing a voltage such as a supply potential VDD, is formed between the interior well 14 and the transistor 16. A p+-type terminal 20 is formed between the transistor 16 and the surrounding well 11, and coupled to ground 13. The gate 19 of the transistor 16 can be coupled to ground in the illustrated embodiment. In other embodiments it may be left floating or coupled to other voltage references.

Figure 2:
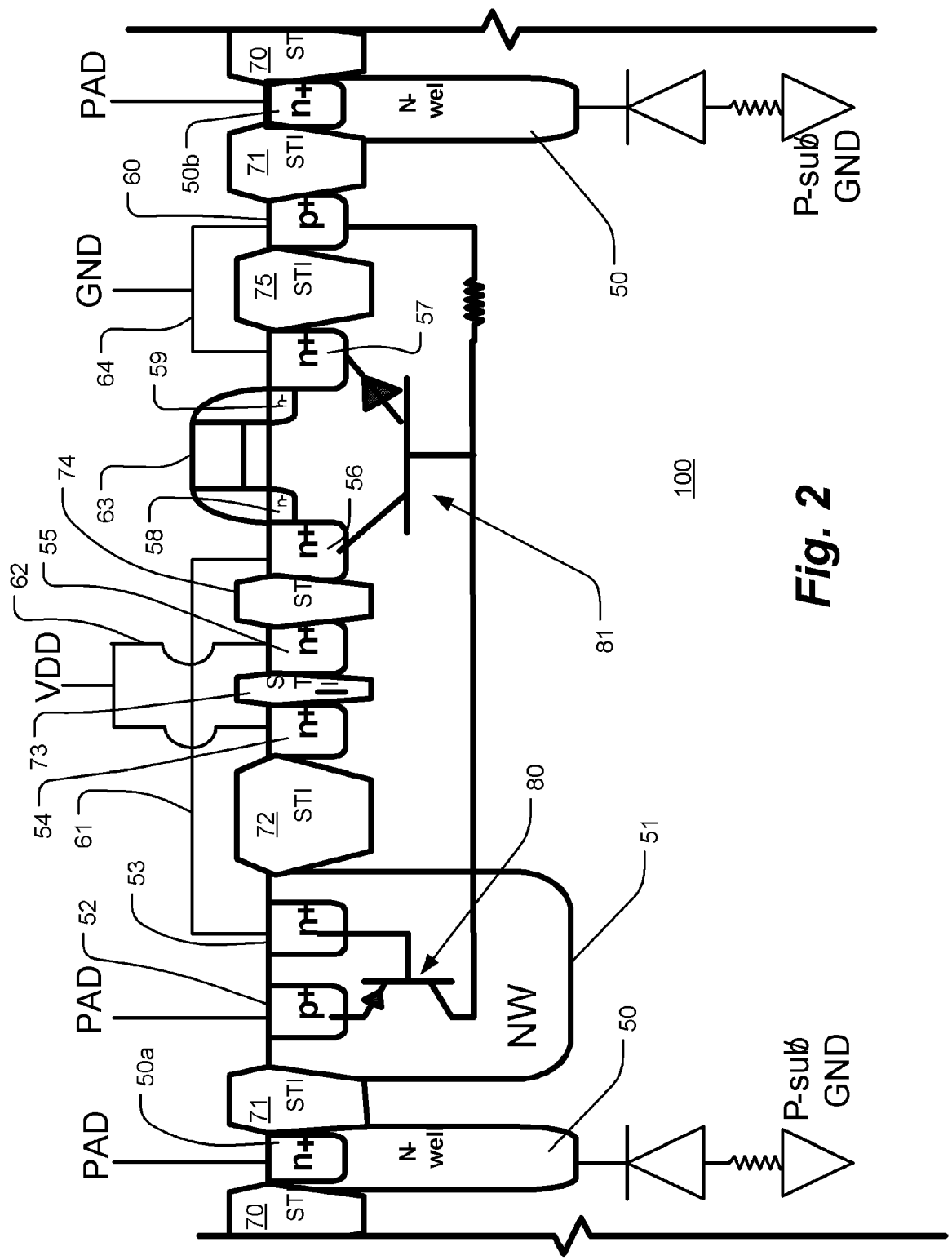
FIG. 2 is a simplified cross-sectional view of an electrostatic discharge circuit in a semiconductor body including a surrounding well.

FIG. 2 shows a cross-sectional view of an implementation of the circuit described schematically with reference FIG. 1, on an integrated circuit substrate including a semiconductor body 100. The semiconductor body can be the bulk wafer, a body formed on an insulator, or some other structure. In cross-section, the surrounding well 50 is shown in a semiconductor body 100 as a deep well coupled to the pad having n-type doping, with portions shown in the cross-section on the left and right sides of the drawing. Trench insulators, such as surrounding well trench insulator 70 and 71 line the sides of the surrounding well 50. The surrounding well trench insulators 70 and 71 can include shallow trench isolation (STI) structures. The surrounding well trench insulator 71 lies between the surrounding well and the interior area within which the diode/transistor discharge circuit is formed. The surrounding well 50 has a depth that is greater than the depth of the surrounding well trench insulator 71. N+-type terminals 50a, 50b are provided in the surface of the surrounding well 50, providing for ohmic contacts with the pad.

A deep interior well 51 having n-type doping is formed on the left side of the area. A p+-type terminal 52 is formed in the deep interior well 51 and coupled to the pad. An n+-type terminal 53 is formed in the interior well 51, and acts as the cathode of the diode formed in the interior well 51. Trench insulator 72 separates the interior well 51 from structures to its right in the drawing. N+-type terminals 54 and 55 in the semiconductor body 100, separated by trench insulator 73, act as bias terminals for latch-up prevention. Trench insulator 74 separates the latch-up prevention terminal 55 from the drain terminal 56 and source terminal 57 of the field effect transistor. The drain terminal 56 is an n+-type region in the semiconductor body 100. Likewise, a source terminal 57 is formed in the semiconductor body 100 and comprises an n+-type region separated from the drain terminal 56 by a channel. In the illustrated embodiment, lightly-doped n-type regions 58, 59 are formed between the drain terminal 56 and source terminal 57, respectively, and the channel region of the transistor. The transistor gate 63 overlies the channel, and is separated from the channel by a gate insulator. The sloped regions adjacent the gate are sidewall elements of the transistor gate. Trench insulator 75 separates the source terminal 57 and drain terminal 56 of the transistor from a p+-type terminal 60, which is a body terminal, with a pickup which is formed in the semiconductor body 100 near the surrounding well trench insulator 71 and surrounding well 50 on the right hand side of the layout. Trench insulator, as indicated by reference numerals 72-75, can include shallow trench isolation (STI) structures. The surrounding well 50 has a depth which is substantially deeper, such as for example 2 to 10 times deeper, than the depths of the n+-type and p+-type terminals, including terminals 52, 53, 54, 55, 56, 57 and 60, making up the discharge circuit, and thereby acts as a current confining structure. The surrounding well 50 is considered substantially deeper than at least one of the bias terminals 54, 55 used for latch-up prevention, and the source terminal 57 and drain terminal 56, when it is has sufficient depth to effect confinement of the charge flow in the parasitic devices.

As shown in the drawing, the terminal 53 acting as the cathode of the diode is connected to the drain 56 of the transistor by an interconnect 61 overlying the semiconductor body. Also, the source 57 of the transistor is coupled to a voltage reference connector ground (GND) and by line 64 to the p+-type terminal 60, which is a body terminal, where line 64 is a connector overlying the semiconductor body 100. The latch-up prevention terminals 54, 55 are coupled to a voltage source, such as the supply potential VDD, by a connector 62 overlying the semiconductor body.

As illustrated in FIG. 2, parasitic bipolar junction transistors 80 and 81 (also forming a silicon controlled rectifier SCR) are formed as a result of this layout. The bipolar junction transistor 80 is a PNP device, in which the p+-type terminal 52 acts as the emitter, the deep n-type well 51 acts as the base, and the p-type semiconductor body acts as the collector. The bipolar junction transistor 81 is an NPN device, in which the drain terminal 56 acts as the collector, the semiconductor body 100 acts as the base, and the source terminal 57 acts as the emitter. In operation, during a positive electrostatic discharge event, current flows in the diode formed by the terminal 52 and terminal 53 to the transistor including drain 56 and source 57 to ground. In addition, current flows in the parasitic bipolar junction transistor 80 formed by terminal 52, the deep n-type well 51, and the semiconductor body 100, injecting positive charge into the base of the bipolar junction transistor 81 and to the p+-type terminal 60, which is connected to the voltage reference connector ground (GND). Also, charge flows into the channel of the field effect transistor raising the substrate bias and assisting turn-on of both the field effect transistor and the bipolar junction transistor 81. The surrounding well 50 tends to confine the current flow from the PNP device 80 to the grounded p+-type terminal 60 within the region, improving a current density in the channel region of the field effect transistor and base of the parasitic NPN device 81, causing more uniform, faster turn-on of the device. In addition, because the surrounding well 50 and deep interior well 51 are coupled to the pad, they achieve essentially the same high voltage as the pad in a high positive voltage discharge event. This causes a reverse bias on the diode formed between the surrounding well 50 and the semiconductor body 100 and a reverse bias on the diode formed between the deep interior well 51 and the substrate. Therefore, positive charge generated from the parasitic PNP bipolar transistor 80 cannot flow through the surrounding well 50. This confines positive charge inside the surrounding well 50.

The surrounding well 50 and interior n-type well 51 are relatively deep wells having depths, for example, on the order of 1 to 1.5 microns. The other n+-type terminals within the area surrounded by the surrounding well can have depths on the order of 0.13 to 0.18 microns in representative systems. Thus, the surrounding well is substantially deeper than at least one of the second pickup and the source and drain terminals. The p+-type terminals within the area can have depths on the order of 0.17 to 0.23 microns. The trench isolation depths are arranged to be deeper than the n+-type and p+-type terminals, such as on the order of 0.28 to 0.35 microns.

The doping concentrations of the surrounding well 50 and interior well 51 can be on the order of $10^{13}/cm^2$. Likewise, the doping concentration of the terminals 52, 53, 54, 55, 56, 57, 60 can be on the order of $10^{15}/cm^2$.

In this manner, the deep surrounding well and deep interior well tend to confine current flow during the discharge event to a volume of the semiconductor body in which it contributes to consistent and fast discharge, while preventing dissipation of charge away from the active current path during the discharge.

Figure 3:
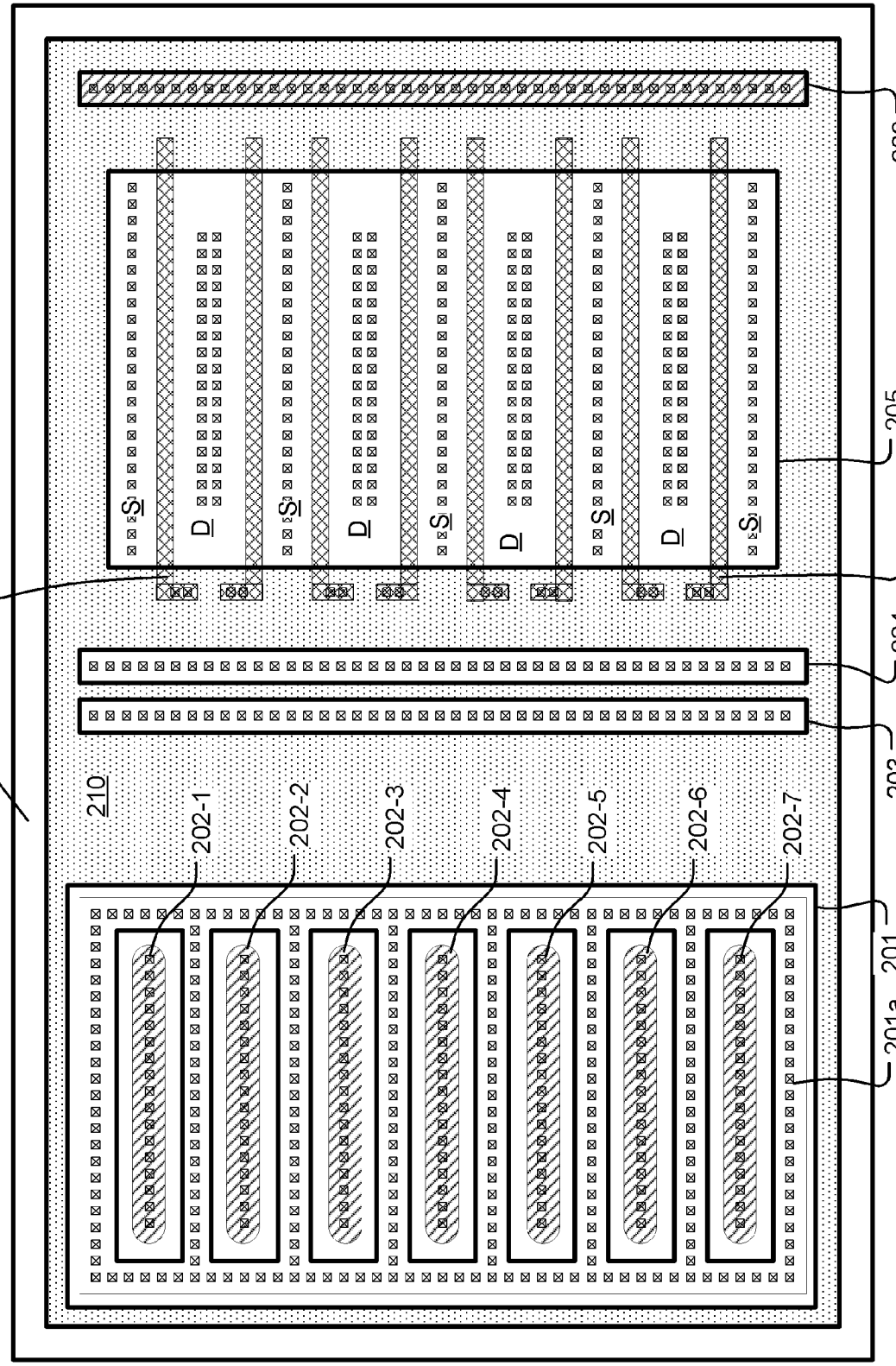
FIG. 3 is a layout view of an electrostatic discharge circuit including a surrounding well.

FIG. 3 is a layout view of an electrostatic discharge circuit like that shown in FIG. 2. Trench insulator 210 separates the various components as described above. The layout shows an n-type surrounding well 200 having a rectangular shape. A deep n-type well 201 is located inside the area surrounded by the surrounding well 200. An n+-terminal 201a is formed inside the deep n-type well 201 in a ladder pattern. P+-terminals 202-1 through 202-7 are located between the horizontal lines in the ladder pattern of the n+-terminal 201a. In this layout, the deep n-type well 201 surrounds the boundary of the n+-terminal 201a. Pickups (represented by small squares marked with an "x") line the surface of the n+-type terminal 201a. Likewise, pickups line the surface of the p+-type terminals 202-1 to 202-7.

N+-type latch-up prevention bias terminals 203 and 204 extend vertically across the area surrounded by the surrounding well 200.

An n+-type active region 205 of the transistor including 5 source regions S and 4 drain regions D is laid out opposite the deep n-type well 201, with the latch-up prevention terminals 203 and 204 in between. Gate structures 211-1 through 211-8 formed by doped polysilicon or metal lines, overlie the active region 205. (Only gate structures 211-1 and 211-8 are labeled to prevent crowding of the drawing.)

A p+-type terminal 206, which is a body terminal, is formed between the active region 205 and the right side of the surrounding well 200, and extends across the area defined by the surrounding well 200. Although not labeled in the drawing, pickups (shown as small squares marked with an "x") on the various terminals, by which the terminals are adapted for connection to voltage reference, a voltage source or otherwise to connect to overlying connectors, as discussed above.

The sizes and numbers of fingers in the interdigitated diode structure within the interior n-type well 201, and the sizes and numbers of the fingers in the interdigitated transistor structure over the active region 205, can vary according to the needs of the particular implementation. Likewise, the number of latch-up prevention bias terminals 203 and 204 can be varied as suits a particular implementation. Similarly, the distance between the deep interior well 201 and the active region 205 can be modified as needed to prevent latch-up and to affect performance of the ESD circuit.

In a representative system, there are 14 p+-terminals having an area of 1.5 by 24 microns in the deep n-type well, rather than the 7 terminals 202-1 to 202-7 in the layout of FIG. 3. Also, in a representative system, the transistor in the active region 205 is laid out with 6 source terminals and 5 drain terminals, having 10 gates, and the gates have a dimension of about 0.6 microns by 30 microns.

Figure 4:
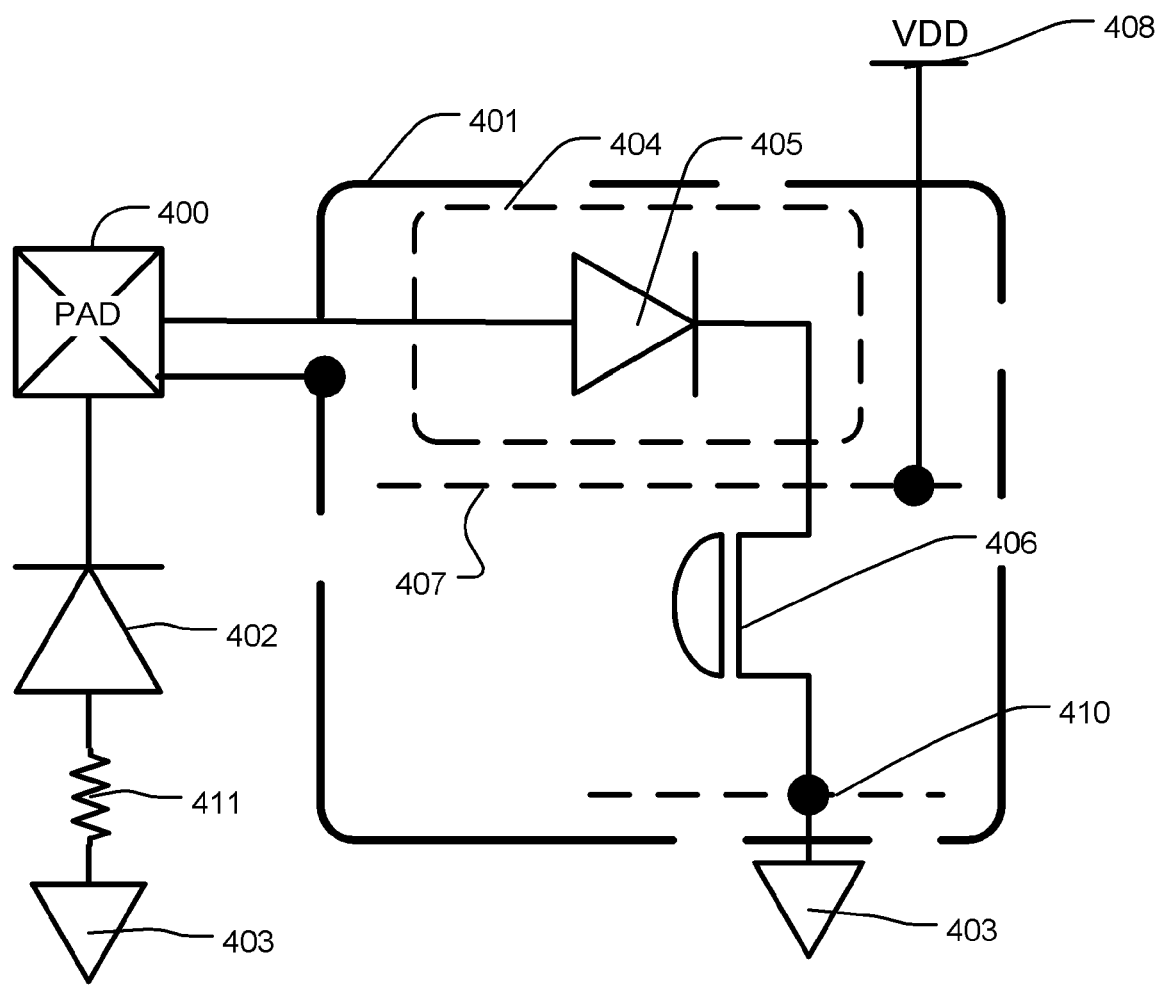
FIG. 4 is a schematic diagram of a first alternative electrostatic discharge circuit including a surrounding well.
Figure 5:
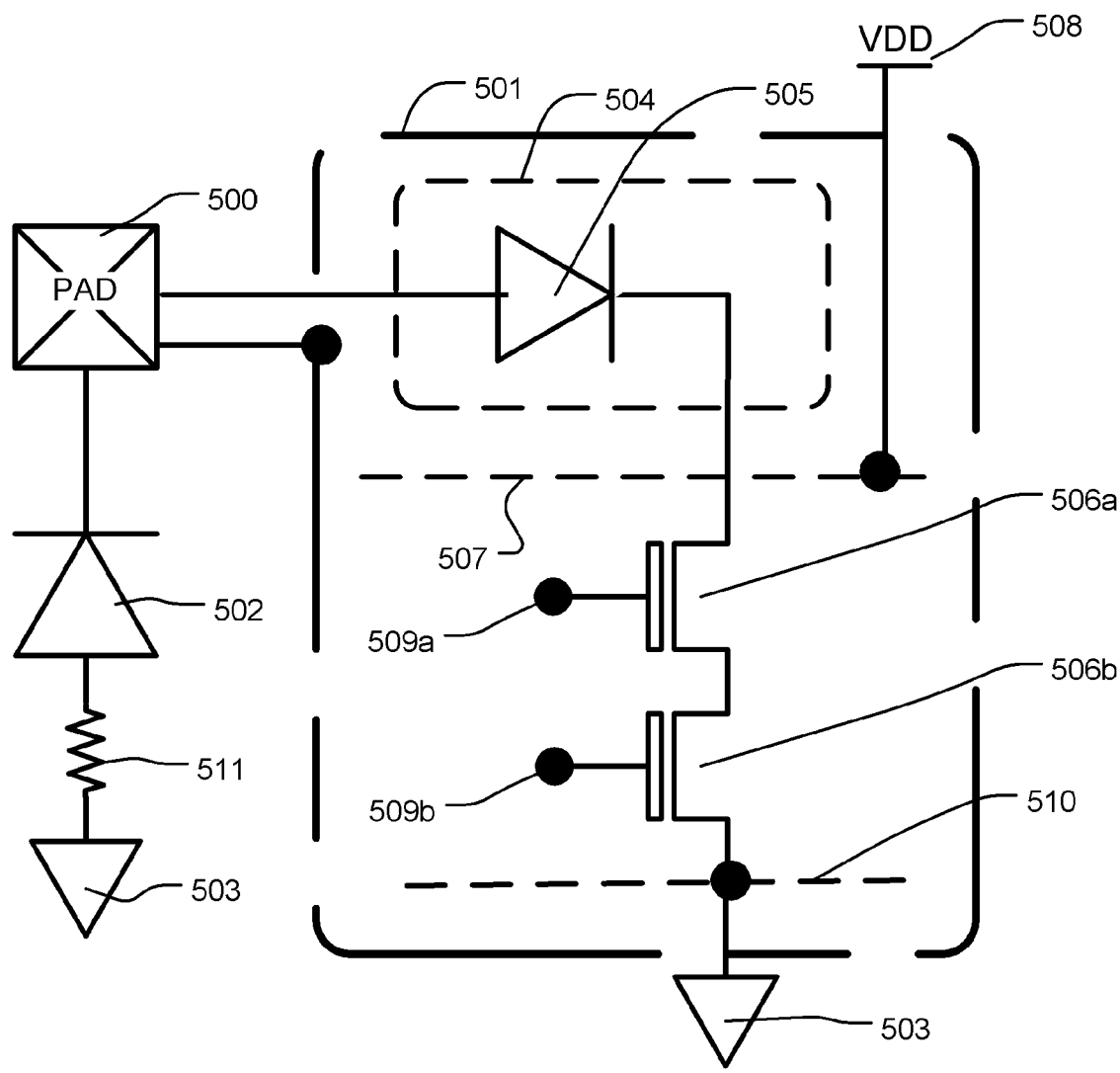
FIG. 5 is a schematic diagram of a second alternative electrostatic discharge circuit including a surrounding well.

FIGS. 4 and 5 are schematic diagrams illustrating alternative electrostatic discharge circuits which can be implemented as described herein with surrounding wells, with alternatives to the n-channel MOS transistor 16 shown in FIG. 1. Other alternatives can be used as well, using transistor structures that form the parasitic NPN bipolar transistor 81 shown in FIG. 2.

In FIG. 4, the transistor 16 shown in FIG. 1 is replaced by a field transistor 406, having a thick oxide layer over the channel. Thus, the circuit in FIG. 4 includes an input/output pad 400 connected to an electrostatic discharge circuit that includes an n-type surrounding well 401 in a p-type semiconductor body. The surrounding well 401 provides the cathode of a diode 402, where the anode of the diode 402 is provided by the semiconductor body. The semiconductor body is coupled with a substrate resistance 411 to ground 403. The surrounding well 401 defines an area within which a second diode 405 and a source and drain of the field transistor 406 are arranged in series between the pad 400 and ground 403. The diode 405 is formed within a deep interior n-type well 404. A latch-up prevention n+-type terminal 407, coupled to a voltage source 408 providing a voltage such as a supply potential VDD, is formed between the interior well 404 and the field transistor 406. A p+-type terminal 410 is formed between the field transistor 406 and the surrounding well 401, and coupled to ground 403.

In FIG. 5, the transistor 16 shown in FIG. 1 is replaced by transistors 506a and 506b in series, at least one of which is biased to be off during normal operation of the integrated circuit on which it is formed. Thus, the circuit in FIG. 5 includes an input/output pad 500 connected to electrostatic discharge circuit that includes an n-type surrounding well 501 in a p-type semiconductor body. The surrounding well 501 provides the cathode of a diode 502, where the anode of the diode 502 is the semiconductor body. The semiconductor body is coupled with a substrate resistance 511 to ground 503. The surrounding well 501 defines an area within which a second diode 505 and a source and drain of the transistor 506a and source and drain of transistor 506b are arranged in series between the pad 500 and ground 503. The diode 505 is formed within a deep interior n-type well 504. A latch-up prevention n+-type terminal 507, coupled to a voltage source 508 providing a voltage such as a supply potential VDD, is formed between the interior well 504 and the transistors 506a and 506b. One or both of the gates 509a and 509b can be coupled to ground to ensure that the current path is off during normal operation. A p+-type terminal 510 is formed between the transistor 506b and the surrounding well 501, and coupled to ground 503.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An electrostatic discharge tolerant device, comprising:
a semiconductor body having a first conductivity type;
a pad on the semiconductor body;
a surrounding well in the semiconductor body, the surrounding well having a second conductivity type, the surrounding well having contacts with the second conductivity type coupled to the pad, the surrounding well surrounding an area in the semiconductor body, the area having the first conductivity type;
an electrostatic discharge circuit in the semiconductor body within said area, the electrostatic discharge circuit including:
a diode having a first terminal with the first conductivity type, the first terminal of the diode having contacts with the first conductivity type coupled to the pad, and the diode having a second terminal with the second conductivity type, the diode in the area; and
a transistor in series between the second terminal of the diode and a voltage reference connector, the transistor in the area, the electrostatic discharge circuit providing a discharge current path in an electrostatic discharge event that forward biases the diode, the discharge current path between the pad and the voltage reference connector, the discharge current path being within a discharge region in said area of the body.

2. The device of claim 1, including:
an interior well in the semiconductor body within said area, the interior well having the second conductivity type;
the first terminal of said diode including a first doped region in the interior well;
the second terminal of said diode including a second doped region in the interior well, the second doped region having the second conductivity type, and the second terminal of said diode having contacts with the second conductivity type coupled to an interconnect;
a source terminal and a drain terminal of said transistor in the semiconductor body within said area and the source terminal and the drain terminal having the second conductivity type, the drain terminal having contacts with the second conductivity type coupled to the interconnect, and the source terminal having contacts with the second conductivity type coupled to the voltage reference connector;
a body terminal within said area, the body terminal having the first conductivity type, the body terminal having contacts with the first conductivity type coupled to the voltage reference connector; and
a bias terminal within said area, the bias terminal having the second conductivity type between the interior well and the drain terminal, the bias terminal having contacts with the second conductivity type for connection to a voltage source other than the voltage reference connector.

3. The device of claim 2, wherein the body terminal, and the source terminal and the drain terminal each have a respective depth, and the surrounding well has a surrounding well depth that is substantially deeper than the respective depth of at least one of the body terminal and the source and drain terminals.

4. The device of claim 2, wherein the body terminal, and the source terminal and the drain terminal each have a respective depth, and the surrounding well has a surrounding well depth that is two to ten times deeper than the respective depth of at least one of the body terminal and the source and drain terminals.

5. The device of claim 1, including:
a surrounding well trench insulator in the semiconductor body between the surrounding well and the area and having a surrounding trench depth, the surrounding well having a depth in the semiconductor body greater than said surrounding trench depth.

6. The device of claim 2, including an interior trench insulator in the semiconductor body between the interior well and the drain terminal and having an interior trench depth, the drain terminal having a depth in the semiconductor body less than said interior trench depth.

7. The device of claim 1, said area including a first part and a second part, and the device including:
an interior trench insulator in the semiconductor body between the first part and the second part of the area;
a surrounding well trench insulator in the semiconductor body between the surrounding well and the area and having a surrounding trench depth, the surrounding well having a depth in the semiconductor body greater than said surrounding trench depth;
an interior well in the semiconductor body, the interior well within the first part of said area and having the second conductivity type, the interior well having a depth in the semiconductor body greater than said surrounding trench depth;
the first terminal of said diode including a first doped region in the interior well, the first doped region having the first conductivity type;
the second terminal of said diode including a second doped region in the interior well, the second doped region having the second conductivity type;
a source terminal and a drain terminal of said transistor in the semiconductor body within the second part of said area and having the second conductivity type, the drain terminal having contacts with the second conductivity type coupled to an interconnect;
a body terminal within the second part of said area, the body terminal having the first conductivity type, the body terminal having contacts with the first conductivity type coupled to the voltage reference connector;
a bias terminal between (i) the first part of said area and (ii) the second part of said area, the bias terminal having the second conductivity type, the bias terminal having contacts with the second conductivity type for connection to a voltage source other than to the voltage reference connector; and
the second terminal of said diode being coupled to the drain terminal of said transistor.

8. The device of claim 1, wherein said drain terminal is coupled to the second terminal of said diode via a second field effect transistor.

9. The device of claim 1, wherein said transistor has a gate having contacts coupled to the voltage reference connector.

10. The device of claim 1, wherein said transistor comprises a field effect transistor.

11. An electrostatic discharge tolerant device, comprising:
a semiconductor body having a first conductivity type;
a pad on the semiconductor body;
a surrounding well in the semiconductor body, the surrounding well having a second conductivity type, the surrounding well having contacts with the second conductivity type coupled to the pad, the surrounding well surrounding an area in the semiconductor body, the area having the first conductivity type;
a latch-up prevention bias terminal in the semiconductor body, the latch-up prevention bias terminal having the second conductivity type and dividing the area into a first part and a second part, the latch-up prevention bias terminal having contacts with the second conductivity type for connection to a voltage source;
an interior well in the semiconductor body, the interior well with the first part of said area and having the second conductivity type;
a first doped region in the interior well, the first doped region having the first conductivity type, the first doped region acting as a first terminal of a diode and the first doped region having contacts with the first conductivity type coupled to the pad, the diode in the area;
a second terminal of said diode including a second doped region in the interior well, the second terminal having the second conductivity type, and the second terminal having contacts with the second conductivity type coupled to an interconnect;
a source terminal and a drain terminal of a transistor in the semiconductor body within the second part of said area and the source terminal and the drain terminal having the second conductivity type, the transistor in the area, the drain terminal having contacts with the second conductivity type coupled to the interconnect, and the source terminal having contacts with the second conductivity type coupled to a voltage reference connector; and a body terminal in the semiconductor body within the second part of said area and having the first conductivity type, the body terminal having contacts with the first conductivity type coupled to the voltage reference connector.

12. The device of claim 11, including a plurality of trench insulators including a first trench insulator between (i) the surrounding well and (ii) the interior well, a second trench insulator between (i) the interior well and (ii) the latch-up prevention bias terminal, a third trench insulator between (i) the latch-up prevention bias terminal and (ii) the source terminal and drain terminals, and a fourth trench insulator between (i) the source terminal and the drain terminal and (ii) the body terminal.

13. The device of claim 11, wherein the body terminal, and the source terminal and the drain terminal each have a respective depth, and the surrounding well has a surrounding well depth that is substantially deeper than the respective depth of at least one of the body terminal and the source terminal and the drain terminal.

14. The device of claim 11, wherein the body terminal, and the source terminal and the drain terminal each have a respective depth, and the surrounding well has a surrounding well depth that is two to ten times deeper than the depth of at least one of the body terminal and the source terminal and the drain terminal.

* * * * *

UNITED STATES PATENT AND TRADEMARK OFFICE
CERTIFICATE OF CORRECTION

| | | |
|---|---|---|
| PATENT NO. | : 9,153,570 B2 | Page 1 of 1 |
| APPLICATION NO. | : 12/712812 | |
| DATED | : October 6, 2015 | |
| INVENTOR(S) | : Shih-Yu Wang et al. | |

It is certified that error appears in the above-identified patent and that said Letters Patent is hereby corrected as shown below:

In the Claims

In claim 11, column 8, line 48, before "the first part," please delete the word "with" and insert the word --within--.

In claim 12, column 9, line 12, replace "drain terminals" with --the drain terminal--.

Signed and Sealed this
Tenth Day of May, 2016

Michelle K. Lee
*Director of the United States Patent and Trademark Office*